United States Patent [19]

Kobayashi

[11] 4,063,170

[45] Dec. 13, 1977

[54] LEVEL METER CIRCUIT

[75] Inventor: Kozo Kobayashi, Kodaira, Japan

[73] Assignee: Nakamichi Research Inc., Kodaira, Japan

[21] Appl. No.: 701,910

[22] Filed: July 1, 1976

Related U.S. Application Data

[63] Continuation-in-part of Ser. No. 542,924, Jan. 22, 1975, abandoned.

[30] Foreign Application Priority Data

Jan. 26, 1974  Japan .................................. 49-11370
Jan. 29, 1974  Japan .................................. 49-12212

[51] Int. Cl.² ............................................ G01R 15/10
[52] U.S. Cl. .................................... 324/132; 328/143
[58] Field of Search ................. 324/132; 328/143, 144, 328/145; 307/230

[56] References Cited

U.S. PATENT DOCUMENTS 3,500,198  3/1970  Kaiser et al. ......................... 324/132

*Primary Examiner*—Rudolph V. Rolinec
*Assistant Examiner*—Ernest F. Karlsen
*Attorney, Agent, or Firm*—Woodling, Krost, Granger & Rust

[57] ABSTRACT

A level meter circuit for indicating a level of input signal over a wide dynamic range, comprising an amplifier of relatively high amplification factor having input terminal means to which an input signal is supplied and output terminal means to be connected to a level meter and negative feedback means including a feedback resistance to feedback an output signal from said output terminal means to said input terminal means, said negative feedback means characterized by further including non-linear impedance means connected in parallel to said feedback resistance and having such characteristics that when said output signal from said output terminal means is below a predetermined level said non-linear impedance means has a substantially infinite impedance and when said output signal from said output terminal means reaches said predetermined level said non-linear impedance means has a predetermined impedance.

3 Claims, 3 Drawing Figures

LEVEL METER CIRCUIT

This Application is a Continuation-in-Part of my Application Ser. No. 542,924, filed Jan. 22, 1975, entitled A Level Meter Circuit, now abandoned.

BACKGROUND OF THE INVENTION

An audio equipment such as tape recorder comprises a level meter for indicating a level of sound signal supplied to the audio equipment and more specifically a peak level of sound signal so that the tape recorder can record the sound signal without any distortion and in a proper manner.

However, the sound signal supplied to the audio equipment tends to have a level varying over a wide range. A conventional level meter provides an indication having a constant sensitivity over a wide dynamic range. Accordingly, the level meter has an improper indication precision because the scale length of the level meter is very narrow at the point of relatively lower level. If the scale length at the point of lower level is determined to be sufficiently large to observe the scale, then the scale length at the point of higher level is too large to provide an indication over a wide range.

SUMMARY OF THE INVENTION

Accordingly, it is a principal object of the present invention to provide a level meter circuit adapted to indicate a signal level of wide dynamic range in a proper manner.

It is another object of the present invention to provide a level meter circuit adapted to follow abrupt variation in a signal level.

The most important feature of the present invention is that negative feedback means including a feedback resistance to feed back an output signal from output terminal means to input terminal means of an amplifier further comprises non-linear impedance means connected in parallel to the feedback resistance and having such characteristics that when the output signal from the output terminal means is below a predetermined level the non-linear impedance means has a substantially infinite impedance and when the output signal from the output terminal means reaches the predetermined level the non-linear impedance means has a predetermined impedance.

The non-linear impedance means may comprise a series connection of a resistance and a semiconductor switching device which is caused to be in the conductive state by the level of the output signal higher than a predetermined value. The semiconductor device may comprise a Zener diode which is broken down by the signal level higher than a predetermined value. Alternatively, it may comprise a transistor with the base reversely biased by a reference voltage corresponding to the predetermined value of the output signal. The non-linear impedance means may comprise a plurality of the series connections connected in parallel to each other. Such non-linear impedance means allows the scale length to vary in a multiple stage.

BRIEF DESCRIPTION OF THE DRAWINGS

The above and other subjects and features of the present invention will be apparent from the description of the preferred embodiments taken with reference to the accompanying drawing in which.

DETAILED DESCRIPTION OF THE PREFERRED EMBODIMENTS

Figure 1:
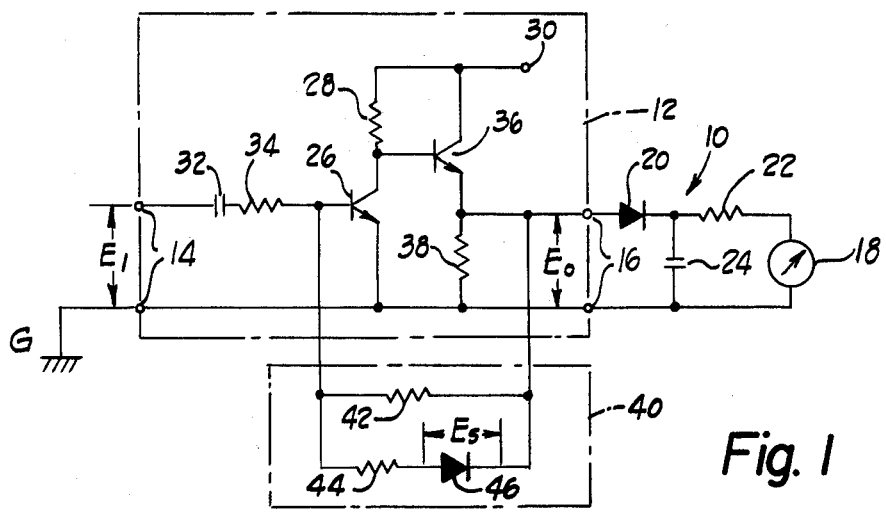
FIG. 1 is a schematic diagram of a level meter circuit embodying the present invention.

Referring now to FIG. 1, there is shown a level meter circuit generally indicated by numeral 10 which comprises an amplifier 12 having an input terminal means 14 to which an input or sound signal $E_i$ is supplied and an output terminal means 16 from which an output signal $E_0$ is the output, and a level meter 18 which is connected through a forwarded diode 20 and a resistance 22 to the output terminal means 16. The diode 20 serves to correct the indication of the output signal corresponding to the input signal less than the voltage across the base and emitter of the first transistor 26. If an error indication of the output signal from the level meter which corresponds to the voltage of the input signal less than the voltage across the base and the emitter of the first transistor 26 may be negligible, than the diode 20 may be omitted. A shunt capacitance 24 has one end connected to the junction between the diode 20 and the resistance 22 and has the other end connected to the side of the level meter 18 opposite to the diode 20 and the resistance 22. This side of the level meter 18 is grounded as seen from FIG. 1. The shunt capacitance 24 serves to be charged by the output signal from the output terminal 16 so that the level meter 18 can indicate a peak level of the output signal corresponding to that of the input signal.

The amplifier 12 is constructed to amplify substantially only one of positive and negative amplitudes of an A.C. input signal supplied to the input terminal means 14, and in the illustrated embodiment, may comprise a first NPN type transistor 26 having an emitter connected to the ground, a collector connected through a resistance 28 to a power supply terminal 30 and a base connected through a capacitance 32 and a resistance 34 to the side of the input terminal means opposite to the grounded side, and a second NPN type transistor 36 having an emitter connected through a resistance 38 to the ground, a collector connected to the power supply terminal 30 and a base connected to the collector of the first transistor 26. The output terminal means 16 are connected across the resistance 38. The amplifier 12 has such a relatively high amplification factor that it can amplify the input signal $E_i$ to produce a greatly amplified output signal $E_0$ from the input terminal means.

Figure 2:
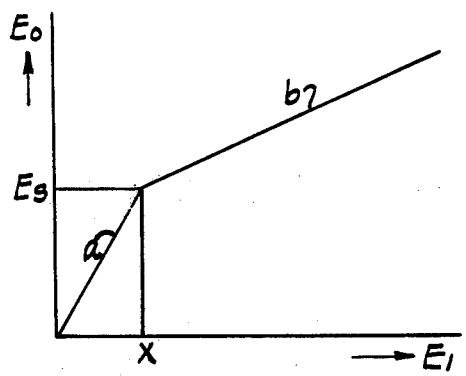
FIG. 2 shows characteristics of an output signal relative to an input signal in accordance with the level meter circuit of FIG. 1.

A negative feedback means 40 is provided which comprises a feedback resistance 42 having one end connected to the side of the output terminal means 16 opposite to the grounded side and the other end connected to the base of the first transistor 26. The negative feedback means 40 further comprises a series connection of a resistance 44 and a Zener diode 46 which is broken down by a level of the output signal $E_0$ equaling or higher than a predetermined value $E_s$ (FIG. 2). The series connection is connected in parallel to the feedback resistance 42 as shown in FIG. 1.

It will be understood that since a bias voltage is not supplied to the base of the first transistor 26, when the input signal $E_i$ is applied to the input terminal means 14 the transistor 26 conducts a current therethrough only during a positive cycle of the input signal. Thus, the input signal is rectified and amplified by the first transistor and the output signal appears at the emitter of the second transistor 36 and therefore, the output terminal means 16. Since the amplifier 12 has a relatively high amplification factor as previously described, the ratio of the output signal $E_0$ to the input signal $E_1$ is determined by the ratio of the feedback resistance to the input resistance. More particularly, in the event that the output signal $E_0$ is lower than the Zener voltage of the Zener diode 46 due to a low input signal, the Zener diode is in the non-conductive state and then the output siganl $E_0$ is fed back only through the feedback resistance 42. However, in the event that the output signal $E_0$ equals or is higher than the Zener voltage, the Zener diode 46 is in the conductive state and then the output signal $E_0$ is fed back through a parallel connection of the resistances 42 and 44 so that the amplification factor of the amplifier 12 is lowered. FIG. 2 shows the characteristics of the output signal relative to the input signal. As seen from this figure, until the output signal $E_0$ reaches the Zener voltage $E_s$ the characteristics of the output signal $E_0$ relative to the input signal $E_1$ is indicated by a highly inclined line $a$ and after the output signal $E_0$ reaches the Zener voltage $E_s$ it is indicated by a gently inclined line $b$. It should be noted that this fact allows the level meter 18 to indicate a lower level of the sound signal at relatively wider scale length and also to indicate a higher level at a relatively narrower scale length so that the level meter can indicate the level of a signal over a wide dynamic range.

Since the output signal $E_0$ is an output from an emitter follower type amplifier 12 and also since the amplifier has a high negative feedback, the output impedance of the amplifier 12 is extremely low, causing the attack time to be shortened with the result that the indication of the level meter can follow quickly any change of the input signal.

Figure 3:
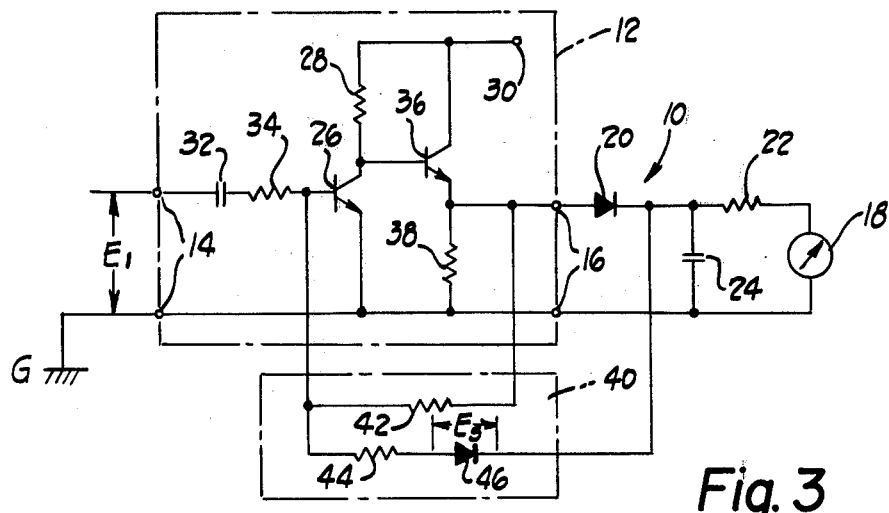
FIG. 3 is a schematic diagram of another embodiment of a level meter circuit embodying the present invention.

FIG. 3 shows another embodiment of the present invention wherein the same numerals designate the same components. In this embodiment, the feedback resistance 42 which is a part of the negative feedback means 40, may have one end connected to the end of the output terminal means 16 opposite to the ground G and may have the other end connected to the base of the first transistor 26. The Zener diode 46 which is also a part of the negative feedback means 40 has the cathode connected to the junction between the diode 20 and the resistance 22 while the resistance 44 which is connected in series at one end to the anode of the Zener diode 46, has the other end connected to the base of the first transistor 26, to which the other end of the resistance 42 is connected as aforementioned. Thus, it will be noted that the series connection of the resistance 44 and the Zener diode 46 is positioned operatively in parallel to the feedback resistance 42 through the diode 20.

It will be noted that the embodiment of FIG. 1, if the capacitance across the electrodes of the Zener diode 46 is relatively large, then the high frequency component of the output signal with one of the polarities varying in amplitude will be fed back through the large capacitance across the electrodes of the Zener diode 46 in a greater amount than the lower frequency component of the output signal, resulting in reduction of the high frequency in the frequency characteristic of indication of the level meter 16. However, it should be noted that in the embodiment of FIG. 3, such reduction of the high frequency in the frequency characteristic can be avoided. More particularly, with the embodiment of FIG. 3, since the output signal at the junction between the diode 20 and the resistance 22 is substantially smoothed by the capacitance 24, it is uniformly fed back regardless of its frequency, and as a result, the frequency characteristic of the indication on the level meter 16 can be flat.

In the embodiments of FIGS. 1 and 3, a plurality of series connections of the resistance and the Zener diode may be provided which have the respective Zener voltages different from each other. Thus, the operation of the level meter circuit may be made at multiple stages, so that the level meter 16 may indicate the level of the input signal over the different scale lengths so as to provide a wider range thereto.

Although some preferred embodiments have been described with reference to the accompanying drawing, it will be understood that they are by way of examples and that various changes and modifications may be made without departing from the spirit and scope of the present invention, which is intended to be defined only by the appended claims.

What is claimed is:

1. A level meter circuit for indicating a level of input signal over a wide dynamic range, comprising an amplifier of relatively high amplification factor having input terminal means to which an input signal is supplied and output terminal means to be connected to a level meter and negative feedback means including a feedback resistance to feedback an output signal from said output terminal means to an input side of said amplifier, and non-linear impedance means operatively connected in parallel to said feedback resistance and having such characteristics that when said output signal from said output terminal means is below a predetermined level said non-linear impedance means has a substantially infinite impedance and when said output signal from said output terminal means reaches said predetermined level said non-linear impedance means has a predetermined impedance, said amplifier including means to amplify and to feed to said ouput terminal means substantially only one of positive and negative amplitudes of an A.C. input signal supplied to said input terminal means, a forwarded diode connected in series with said level meter between said output terminal and said level meter, and a capacitance connected in parallel with said level meter, with one end of said capacitance being connected to said forwarded diode at the level meter side thereof, and wherein said non-linear impedance means has one end connected to the point of the junction between said forwarded diode and said capacitance and the other end connected to said input side of said amplifier so as to be operatively connected in parallel to said feedback resistance.

2. A level meter circuit as set forth in claim 1, wherein said non-linear impedance means comprises a series connection of a resistance and a semiconductor switching device which is caused to be in the conductive state by the level of said output signal reaching said predetermined level.

3. A level meter circuit as set forth in claim 2, wherein said semiconductor switching means comprises a Zener diode which is broken down by the level of said output signal reaching said predetermined level.

* * * * *